US007548741B2

(12) United States Patent
Church

(10) Patent No.: US 7,548,741 B2
(45) Date of Patent: Jun. 16, 2009

(54) DUAL LOGARITHMIC AMPLIFIER PHASE-MAGNITUDE DETECTOR

(75) Inventor: Richard E. Church, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 466 days.

(21) Appl. No.: 11/468,119

(22) Filed: Aug. 29, 2006

(65) Prior Publication Data
US 2007/0082627 A1 Apr. 12, 2007

Related U.S. Application Data

(60) Provisional application No. 60/713,656, filed on Sep. 2, 2005.

(51) Int. Cl.
*H04B 1/18* (2006.01)
(52) U.S. Cl. .................. 455/280; 455/194.2; 455/67.16; 455/572; 324/76.77; 324/76.82; 327/52
(58) Field of Classification Search ............... 455/280, 455/289, 296, 334, 341, 130, 194.2, 311, 455/338, 67.11, 67.16, 572; 324/76.77, 76.12, 324/76.82, 158.1; 327/52, 89, 90, 96
See application file for complete search history.

(56) References Cited

U.S. PATENT DOCUMENTS

| 6,822,433 | B1 * | 11/2004 | Gilbert | .................. 324/76.77 |
| 7,091,714 | B2 * | 8/2006 | Gilbert | .................. 324/76.77 |
| 2005/0061442 | A1 | 3/2005 | Higashiura | |

FOREIGN PATENT DOCUMENTS

| EP | 1248361 | 10/2002 |
| JP | 6011528 | 1/1994 |

* cited by examiner

*Primary Examiner*—Tony T Nguyen
(74) *Attorney, Agent, or Firm*—Harness, Dickey & Pierce, P.L.C.

(57) ABSTRACT

A power generation system including a RF power generator which provides a RF output power. The power distribution system includes a phase-magnitude detector module having a dual logarithmic amplifier phase-magnitude detector. The dual logarithmic amplifier phase-magnitude detector receives current and voltage signals. The dual logarithmic amplifier phase-magnitude detector generates a phase signal that varies in accordance with the phase between the voltage signal and the current signal and a magnitude signal that varies in accordance with the magnitude between the voltage and current signals. A controller receives the phase and magnitude signal and communicates control signals to the matching network.

21 Claims, 5 Drawing Sheets

DUAL LOGARITHMIC AMPLIFIER PHASE-MAGNITUDE DETECTOR

CROSS-REFERENCE TO RELATED APPLICATIONS

This application claims the benefit of U.S. Provisional Application No. 60/713,656, filed on Sep. 2, 2005. The disclosure of the above application is incorporated herein by reference.

FIELD

The present teachings relate to a phase and magnitude detector, and, more particularly, to a phase and magnitude detector implemented using a logarithmic amplifier

BACKGROUND

Conventional phase and magnitude detectors typically receive an input voltage and an input current signal and generate a magnitude and phase output signal. The magnitude output signal typically reflects a relationship of the magnitudes of the input signals. The phase output signal typically indicates the phase difference between the input voltage and current signals. In plasma generation systems, phase-magnitude detectors can be implemented in various configurations.

One configuration utilizes un-tuned (broadband) detectors. Examples of the un-tuned detectors include line section samplers used in the matching networks manufactured by the assignee of this subject patent application and sold under the brand name Matchwork®. Un-tuned detectors function well for single-process plasma recipes, and can be configured to function acceptably in the presence of harmonics, where the relative amplitude and phase of the harmonic content remains substantially constant. When process recipes change, harmonics often change, leading to unacceptable performance of the untuned detectors.

Another configuration of a phase-magnitude utilizes tuned phase-magnitude detectors. These detectors address the problem of variable harmonic content by employing bandpass filtering of the sampled voltage and current signals before application to a detector bridge circuit. The detector bridge circuit operates in quadrature phase, allowing diode detectors to discriminate the phase of the incoming signals. Recent dual-frequency systems that produce intermodulation distortion products that are very close (less than 5%) in terms of percent frequency from the desired signal frequency have resulted in phase-magnitude detector performance that is less than optimal.

Another configuration of a phase-magnitude detector utilizes quadrature phase-magnitude detectors. This system uses two quadrature demodulators to perform an analog mix of the two sampled RF voltage and current waveforms to a zero- or low-intermediate frequency (IF). The mixers are driven from a common local oscillator (LO), which is either an amplified reference of the sampled RF signals, or is phase-locked to one or both of the sampled RF signals. The four analog output voltages, the in-phase and quadrature components, from the two quadrature demodulators are then digitally sampled. The digital signals are then processed to provide the magnitude of each original RF sample, and the phase relationship of each, referenced to the LO, and hence each other. This provides the necessary magnitude and phase information of the original sampled RF signals.

One additional configuration of phase-magnitude detectors utilizes exclusive-OR phase detectors. Such detectors include high-speed comparator peak detectors for impedance magnitude.

SUMMARY

A power generation system including a RF power generator which provides a RF output power. A matching network communicates with the RF power generator and receives the RF output power. The matching network communicates with a load and has a variable impedance. A phase-magnitude detector module receives at least one signal that varies in accordance with the RF output power. The phase-magnitude detector module includes a dual logarithmic amplifier phase-magnitude detector. The dual logarithmic amplifier phase-magnitude detector receives a current signal that varies in accordance with a current of the RF output power and a voltage signal that varies in accordance with a voltage of the RF output power. The dual logarithmic amplifier phase-magnitude detector generates a phase signal that varies in accordance with the phase between the voltage signal and the current signal and a magnitude signal that varies in accordance with the magnitude between the voltage and current signals. A controller receives the phase and magnitude signals and communicates control signals to the matching network.

A power generation system includes a RF power generator that provides a RF output power. A matching network communicates with the RF power generator and receives the RF output power. The matching network communicates with a load and has a variable impedance. A phase-magnitude detector module receives at least one composite signal that varies in accordance with the RF output power. The composite signal includes a current signal that varies in accordance with a current of the RF output power and a voltage signal that varies in accordance with a voltage of the RF output power. The phase-magnitude detector module includes a lead network for receiving the current signal and applying a phase lead to the current signal to generate a phase led signal. A lag network receives the voltage signal and applies a phase lag to the voltage signal to generate a phase lag signal. A dual logarithmic amplifier phase-magnitude detector receives the phase led and phase lag signals and generates a phase signal that varies in accordance with the phase between the voltage signal and the current signal and a magnitude signal that varies in accordance with the magnitude between the voltage and current signals. A controller receives the phase and magnitude signals and communicates control signal to the matching network.

DRAWINGS

The drawings described herein are for illustration purposes only and are not intended to limit the scope of the present teachings in any way.

DESCRIPTION OF VARIOUS EMBODIMENTS

The following description of various embodiments is merely exemplary in nature and is in no way intended to limit the present teachings, application, or uses.

Figure 1:
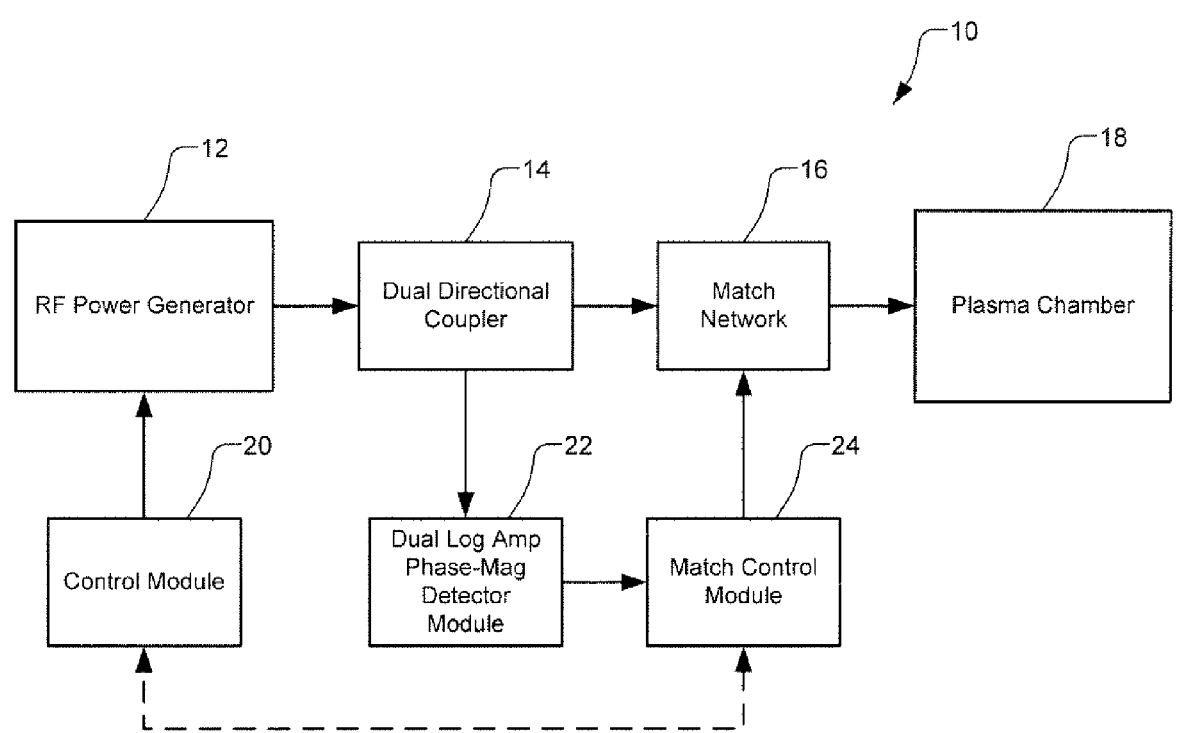
FIG. 1 is a block diagram a plasma generation system including a dual logarithmic amplifier phase-magnitude detector arranged in accordance with various embodiments.

FIG. 1 depicts a plasma control system 10 in which the dual logarithmic amplifier phase-magnitude detector may be implemented for controlling a plasma chamber. Control system 10 includes a plasma chamber 18, such as may be used for fabricating integrated circuits. Plasma chamber 18 includes one or a plurality of gas inlets and one or a plurality of gas outlets (not shown). The gas inlets and outlets enable the introduction and evacuation of gas from the interior of plasma chamber 18. A control module 20 receives various inputs, including inputs from the plasma chamber, which may include a vacuum signal which indicates the level of vacuum in the chamber, a voltage signal, and a signal indicating the ratio of flows between the inlet and outlet gases. As one skilled in the art will recognize, other inputs/outputs may also be received/generated by controller 20. Controller 20 determines a desired input power to be applied to plasma chamber through a power source or generator 12, which may be a RF power generator. Power generator 12 may include a microprocessor, or other similar controller, which receives the applied signal from controller 20. Power generator 12 outputs a signal, such as a RF signal, which is input to a matching network 16 through a directional coupler 14, such as a dual directional coupler. One skilled in the art will recognize that a voltage/current (V/I) coupler may be substituted for directional coupler 14. Match network 16 helps to regulate the impedance match between plasma chamber 18 and RF power generator 12.

Dual directional coupler 14 outputs a voltage and a current signal to dual logarithmic amplifier phase-magnitude detector (dual log amp phase-mag detector) module 22. Dual log amp phase-mag detector module 22 determines a magnitude signal, a phase signal, and a reference signal and outputs the signals to match control module 24. Match control module 24 analyzes the signals output from dual log amp phase-mag detector module 22 and generates control signals to match network 16. The control signals control match network 16 in order to vary the impedance generated by match network 16 to properly match impedance between RF power generator 12 and plasma chamber 18. Match control module 24 may also communicate with control module 20.

Figure 2:
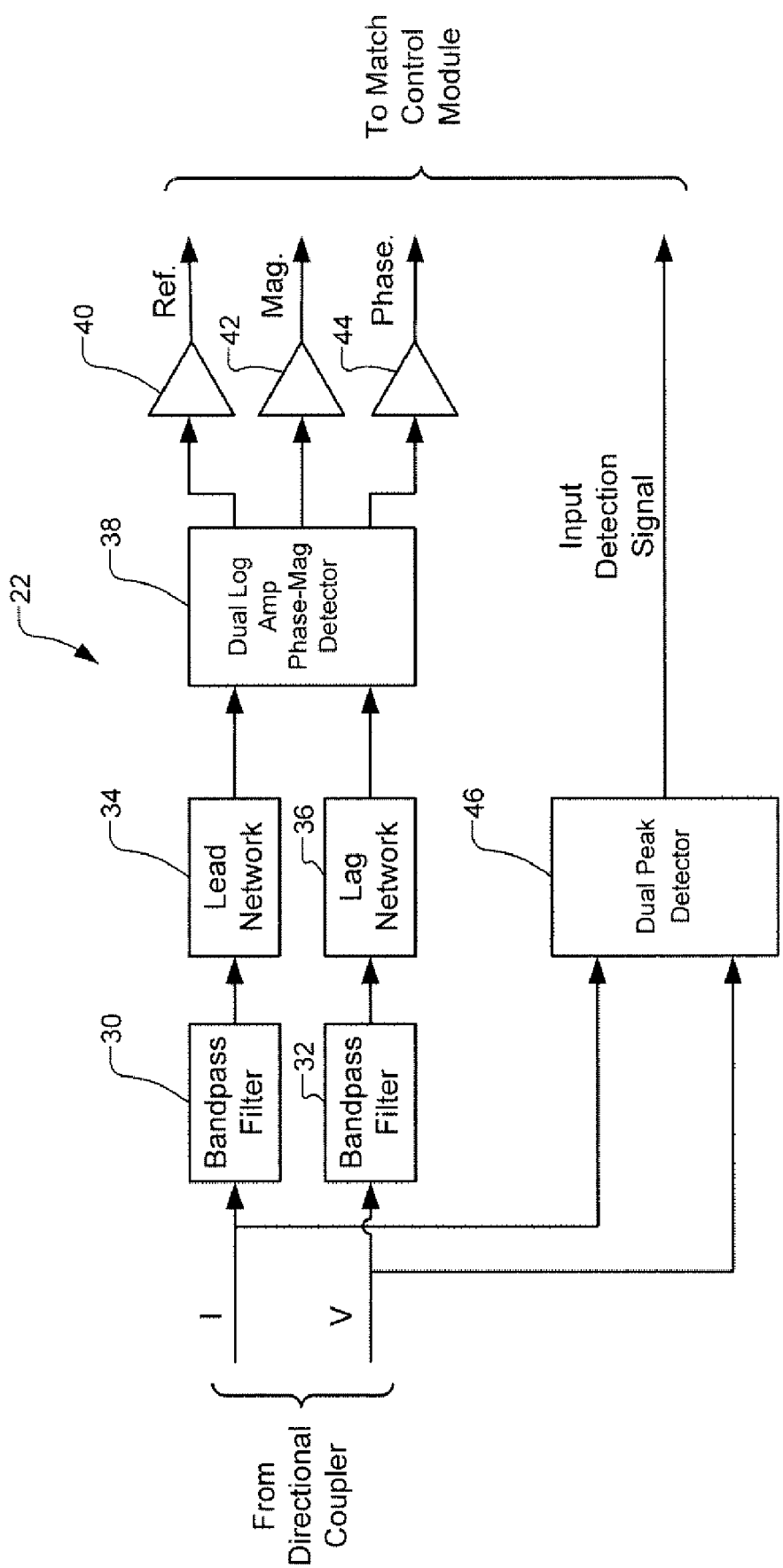
FIG. 2 is a block diagram of the dual logarithmic amplifier phase-magnitude detector arranged in accordance with various embodiments.
Figure 3:
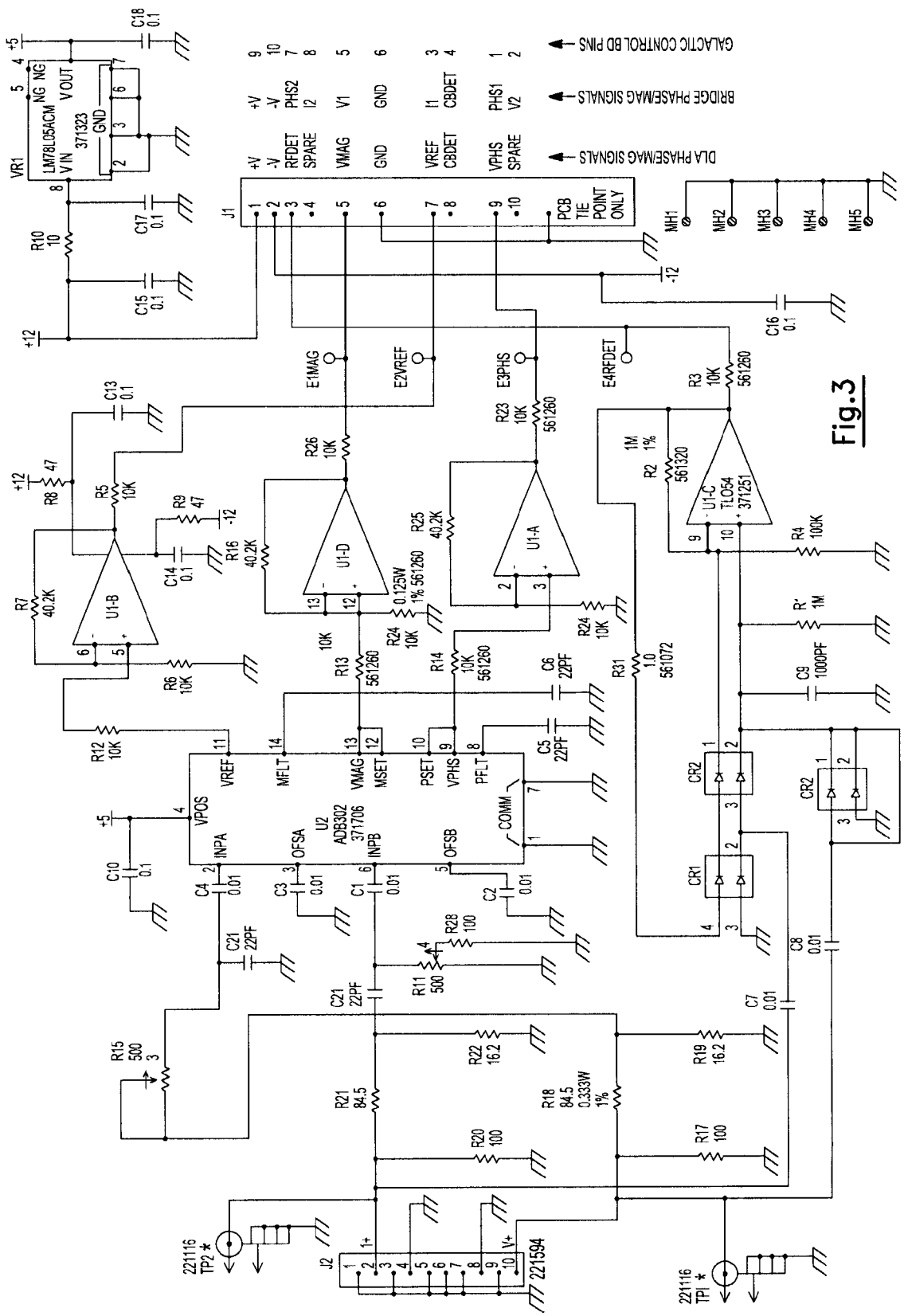
FIG. 3 is a circuit diagram of the dual logarithmic amplifier phase-magnitude detector.

FIG. 2 depicts a block diagram of dual log amp phase-mag detector module 22 of FIG. 1. Dual log amp phase-mag detector module 22 receives a current (I) signal and voltage (V) signal output from directional coupler 14 of FIG. 1. The current I and voltage V signals are applied to respective bandpass filters 30, 32, which output signals in a frequency range in accordance with the predetermined bandpass filter range. The output from bandpass filter 30 is applied to lead network 34, which introduces a phase lead into the signal output from bandpass filter 30. The signal output from bandpass filter 32 is applied to lag network 36. Lag network 36 introduces a phase lag in the signal output by bandpass filter 32. The signals output by lead network 34 and lag network 36 are applied to dual log amp phase-mag detector 38.

Dual log amp phase-mag detector 38 outputs three signals. One first signal output by dual log amp phase-mag detector 38 is a phase signal. A phase signal is proportional to the phase difference between voltage and current. Dual log amp phase-mag detector 38 also outputs a reference signal, which is a reference voltage utilized by match control module 24. Dual log amp phase-mag detector 38 also outputs a magnitude signal which can be proportional to the decibel ratio of the current and voltage signals received from directional coupler 14. The reference, magnitude, and phase signals are applied to respective buffers 40, 42, 44 and communicated to match control module 24.

Dual log amp phase-mag detector module 22 also includes a dual peak detector 46. Dual peak detector 46 senses the respective current I and voltage V signals and generates an input detection signal to match control module 24. Dual peak detector 46 essentially verifies that signals other than noise are present on either the current I and voltage V outputs of dual directional coupler 14. In some embodiments, dual log amp phase-mag detector 38 is implemented utilizing a RF/IF gain and phase detector, part number AD8302 produced by Analog Devices, Inc. Such a dual log amp phase-mag detector can be found with reference to U.S. Pat. No. 6,822,433, issued November 23, 204, the disclosure of which is incorporated in its entirety herein.

In various embodiments, dual directional coupler 14 provides samples of the RF voltage and current waveforms present on the main line of the housing. The sample amplitudes can be within a few decibel (dB) (such as <6 dB) amplitude of each other, and less than +20 dBm when the main line signal is largest. In various embodiments, the phase characteristic should also be known. In some embodiments, near quadrature phase is desirable, with the voltage sample being near +90 degrees referenced to the main line. The current sample can be nearly zero degrees due to the light coupling and resistive termination of the coupling transformer.

In some embodiments, the dual log amp phase-mag detector module 22 has resistive pad attenuators on each channel for closer matching of the incoming sample channel amplitudes. One skilled in the art will recognize that bandpass filters 30, 32 may be replaced by low pass filters for each channel. The need for either filter varies upon testing indicating that these are necessary for performance in the presence of strong interfering signals. In some embodiments, a final amplitude and phase adjustment is allowed before the two sample channels (I and V) are applied to the inputs of the dual log amp magnitude and phase detector 38. The magnitude output from dual log amp phase-mag detector 38 is linear in dB difference, the phase output is linear in phase difference from quadrature, and a reference voltage establishes the zero reference for subsequent processing.

In some embodiments, the dual peak detector 46 of dual log amp mag-phase detector 22 is a dual compensated diode detector, which is used as a signal presence detector to allow the match control module 24 to determine when to respond to any error signal present from the dual log amp detector module 22. In some embodiments, the signal presence detector is implemented with a discrete temperature-compensated diode detector circuit because the measured linearity and temperature stability of the circuit seems better than alternate detectors. Various alternative detectors include any of several integrated schottky diode detectors designed for received signal strength indicator (RSSI) or transmit power level indicator applications. Alternatives also include transistor-based compensated diode detectors.

Figure 4:
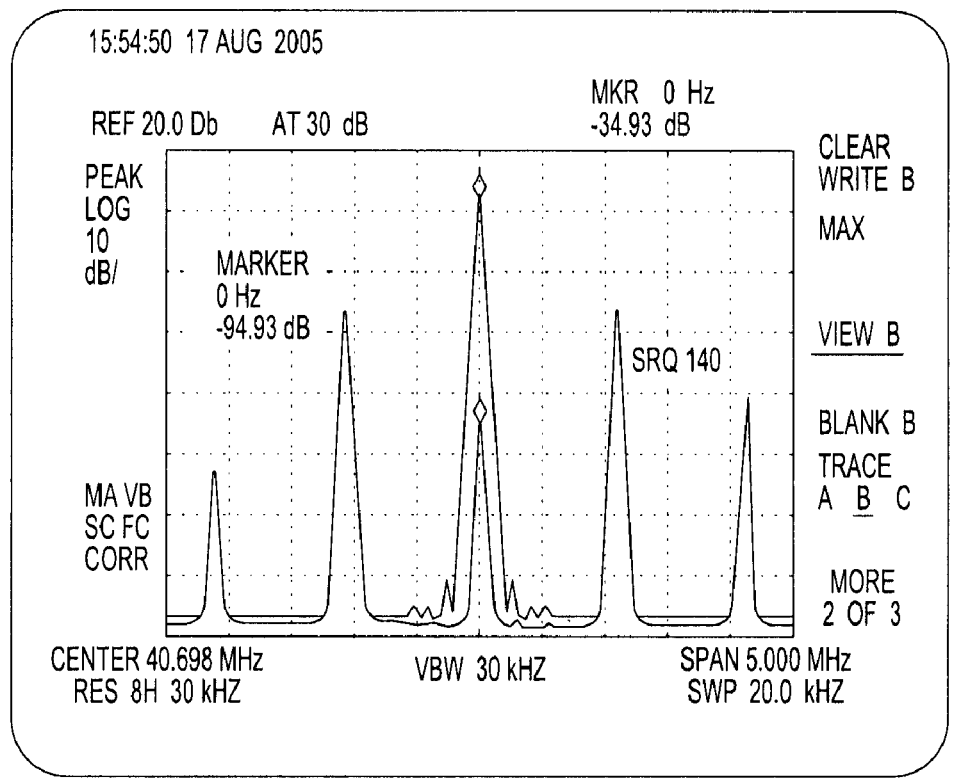
FIGS. 4-5 are waveforms depicting the forward and reflected power in systems utilizing the dual logarithmic amplifier phase-magnitude detector arranged in accordance with various embodiments.
Figure 5:
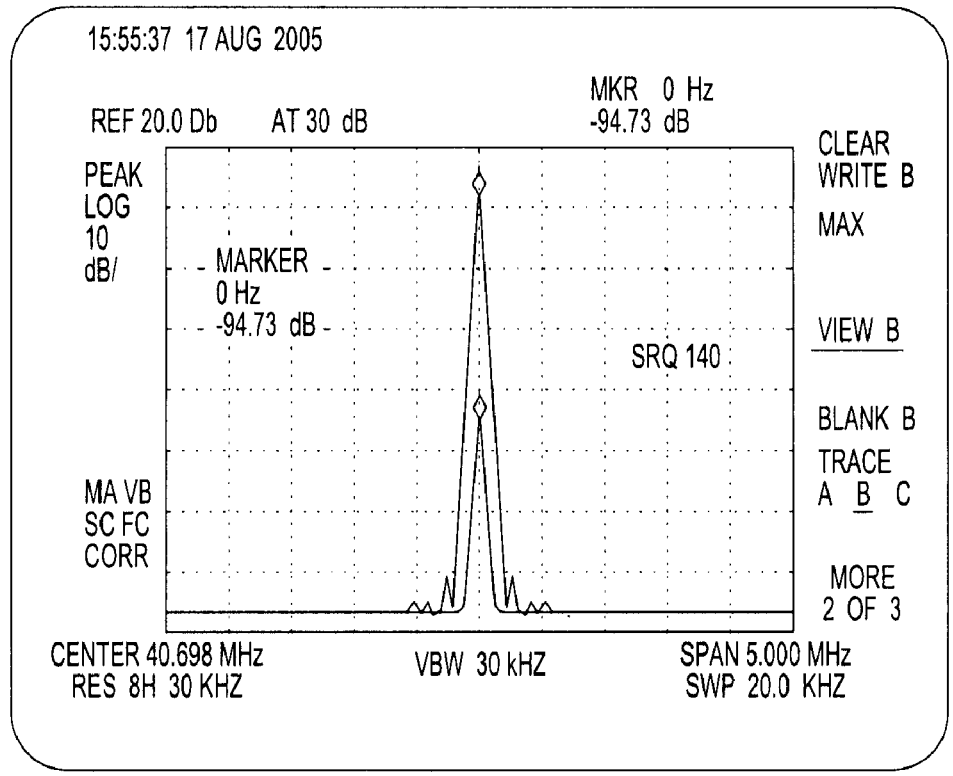
Figure 6:
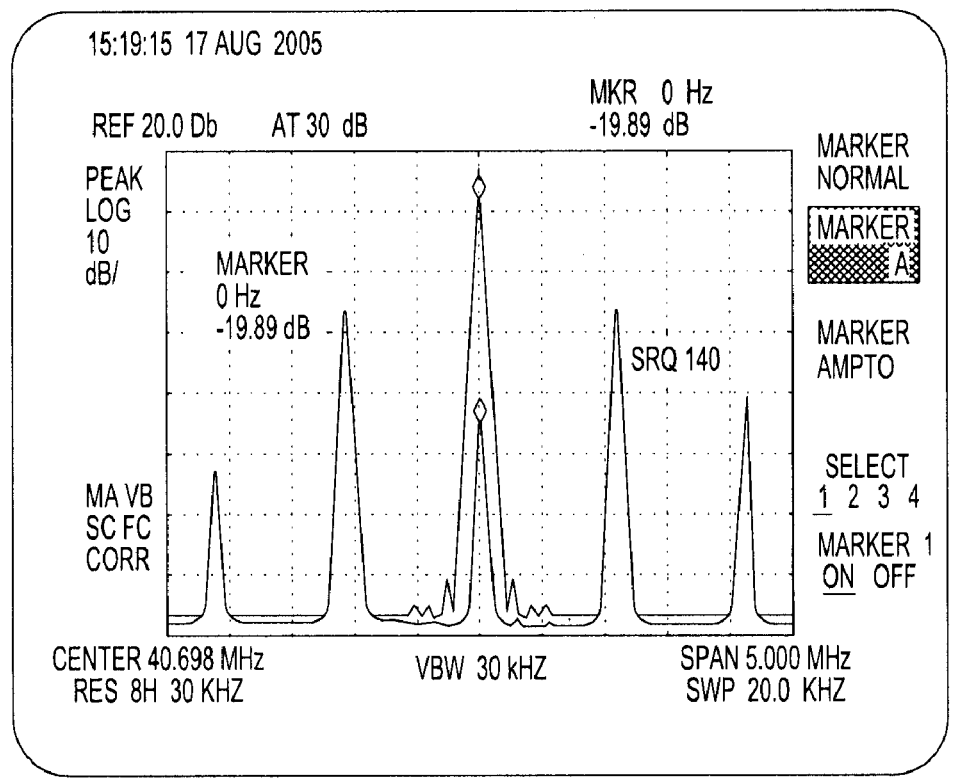
FIGS. 6-7 are waveforms depicting the forward and reflected power in systems utilizing a conventional phase-magnitude detector.
Figure 7:
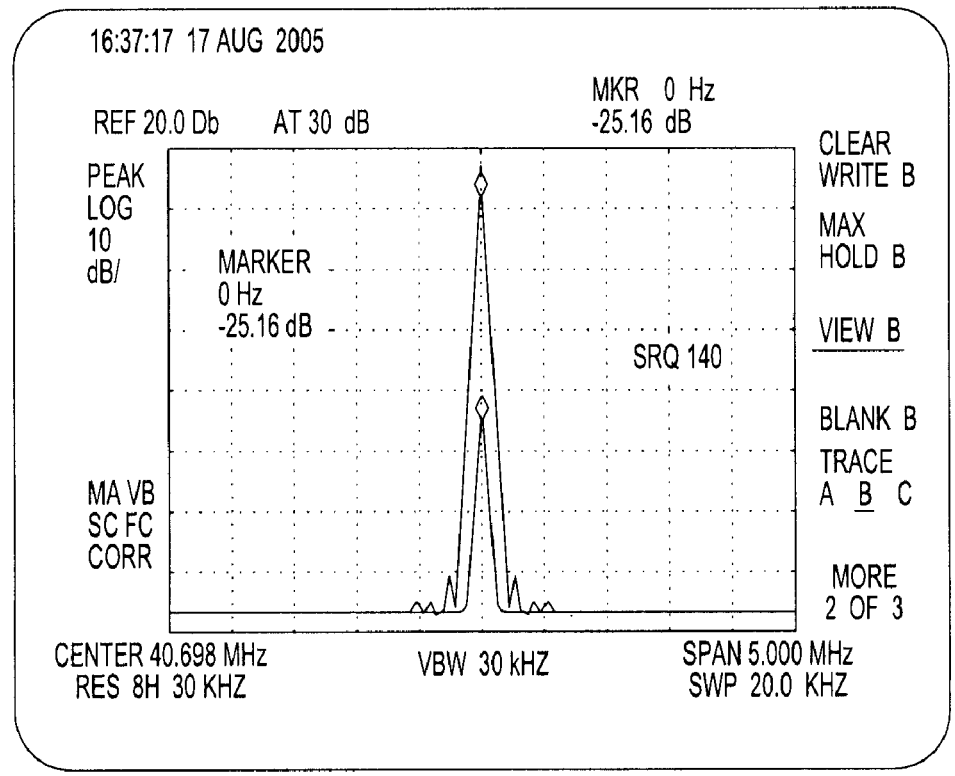

The various embodiments provide improved rejection of interfering tones when tuning a matchwork. FIGS. 4 and 5 depict waveforms of forward and reflected power for a system utilizing the dual logarithmic amplifier magnitude-phase detector as described herein. By contrast, FIGS. 6 and 7 depict waveforms of forward and reflected power for a system utilizing a conventional phase-magnitude detector. The waveforms of forward power superimposed on reflected power provide a measure of the quality of the match between the power generation system and the plasma chamber. FIG. 4 indicates a −34.9 db input return loss utilizing the dual logarithmic magnitude-phase detector. Likewise in FIG. 5, the waveforms indicate a −34.7 dB input return loss. Note particularly with respect to FIG. 5 that no degradation of input return loss on the fundamental frequency of 40.68 MHz signal in the presence of −10 dBc intermodulation distortion (IMD) products at plus/minus 1 MHz. FIG. 6, on the other hand, indicates that the matching networks utilizing the conventional phase-magnitude detectors provide only approximately −19.9 dBc input return loss in the presence of IMD products. FIG. 7 indicates an input return loss of −25 dBc for a signal having a clean RF input.

In various embodiments, the dual logarithmic amplifier phase-magnitude detector utilizes identical logarithmic amplifier strips to provide saturated V and I sample signals applied to an exclusive-OR phase detector. The logarithmic amplifier stage detectors provide average power level output signals applied to the summing junction of the magnitude error signal amplifier. The inherent detection of the dual logarithmic amplifier system does not necessarily rely on filtering of the input signals. Filter requirements are then greatly relaxed or non-existent. In various other embodiments, the dual logarithmic amplifier circuit can be implemented using emitter-coupled-logic line receivers to amplify and then detect the sampled signal phase difference with an exclusive-OR gate. The exclusive-OR phase detector operates on a similar principle as the AB8302 integrated circuit.

In various other embodiments, the dual logarithmic amplifier circuit could be implemented with a less integrated approach utilizing independent logarithmic amplifiers and separate phase detectors. Implementation with a less integrated approach may allow for the use of either or both logarithmic amplifier outputs as an RSSI or RF power presence and level detector output. This would render the dual diode peak detector effectively redundant and unnecessary.

The description of the invention is merely exemplary in nature and, thus, variations that do not depart from the gist of the teaching are intended to be within the scope therein. Such variations are not to be regarded as a departure from the spirit and scope of the teachings.

What is claimed is:

1. A power generation system comprising:
   a RF power generator, the RF power generator providing a RF output power;
   a matching network communicating with the RF power generator and receiving the RF output power, the matching network communicating with a load and having a variable impedance;
   a phase-magnitude detector module receiving at least one signal that varies in accordance with the RF output power, the phase-magnitude detector including a dual logarithmic amplifier phase-magnitude detector, the dual logarithmic amplifier phase-magnitude detector receiving a current signal that varies in accordance with a current of the RF output power and a voltage signal that varies in accordance with a voltage of the RF output power, the dual logarithmic amplifier phase-magnitude detector generating a phase signal that varies in accordance with the phase between the voltage signal and the current signal and a magnitude signal that varies in accordance with the magnitude between the voltage and current signals; and
   a controller for receiving the phase and magnitude signal and communicating at least one control signal to the matching network to vary the impedance.

2. The power generation system of claim 1 wherein the controller is a match controller and the power generation system further comprises a power controller for generating at least one control signal communicated to the RF power generator.

3. The power generation system of claim 2 wherein the load is a plasma chamber.

4. The power generation system of claim 1 further comprising a coupler interposed between the RF power generator and the matching network, the coupler communicating the at least one signal to phase-magnitude detector module and communicating the RF output signal from the RF power generator to the matching network.

5. The power generation system of claim 1 wherein the dual logarithmic amplifier phase-magnitude detector generates a reference signal.

6. The power generation system of claim 1 wherein the dual phase-magnitude detector module further comprises a dual peak detector, the dual peak detector receiving the current signal and the voltage signal and generating a detection signal, the detection signal indicating that at least one of the current and voltage signal contain information other than noise.

7. The power generation system of claim 6 wherein the dual peak detector is a dual compensated diode detector.

8. The power generation system of claim 6 wherein the dual peak detector is implemented as a temperature-compensated diode detector.

9. The power generation system of claim 1 wherein the dual phase-magnitude detector module further comprises resistive pads for receiving the voltage signal and the current signal.

10. A power generation system comprising:
    a RF power generator, the RF power generator providing a RF output power;
    a matching network communicating with the RF power generator and receiving the RF output power, the matching network communicating with a load and having a variable impedance;
    a phase-magnitude detector module receiving at least one signal that varies in accordance with the RF output power, the at least one signal including a current signal that varies in accordance with a current of the RF output power and a voltage signal that varies in accordance with a voltage of the RF output power, the phase-magnitude detector module including:
       a lead network module for receiving the current signal and applying a phase lead to the current signal to generate a phase led signal;
       a lag network module for receiving the voltage signal and applying a phase lag to the voltage signal to generate a phase lag signal; and
       a dual logarithmic amplifier phase-magnitude detector, the dual logarithmic amplifier phase-magnitude detector receiving the phase led signal and the phase lag signal, the dual logarithmic amplifier phase-magnitude detector generating a phase signal that varies in accordance with the phase between the voltage signal and the current signal and a magnitude signal that varies in accordance with the magnitude between the voltage and current signals; and
    a controller for receiving the phase and magnitude signal and communicating at least one control signal to the matching network to vary the impedance.

11. The power generation system of claim 10 wherein the controller is a match controller and the power generation system further comprises a power controller for generating control signals communicated to the RF power generator.

12. The power generation system of claim 11 further comprising coupler interposed between the RF power generator and the matching network, the coupler communicating the at least one composite signal to phase-magnitude detector module and communicating the RF output signal from the RF power generator to the matching network.

13. The power generation system of claim 10 wherein the load is a plasma chamber.

14. The power generation system of claim 10 wherein the dual logarithmic amplifier phase-magnitude detector generates a reference signal.

15. The power generation system of claim 10 wherein the dual phase-magnitude detector module further comprises a dual peak detector, the dual peak detector receiving the current signal and the voltage signal and generating a detection signal, the detection signal indicating that at least one of the current and voltage signal contain information other than noise.

16. The power generation system of claim 15 wherein the dual peak detector is a dual compensated diode detector.

17. The power generation system of claim 15 wherein the dual peak detector is implemented as a temperature-compensated diode detector.

18. The power generation system of claim 10 wherein the dual phase-magnitude detector module further comprises resistive pads for receiving the voltage signal and the current signal.

19. A power generation system comprising:
a RF power generator, the RF power generator providing a RF output power;
a matching network communicating with the RF power generator and receiving the RF output power, the matching network communicating with a load and having a variable impedance;
a phase-magnitude detector module receiving at least one signal that varies in accordance with the RF output power, the at least one signal including a current signal that varies in accordance with a current of the RF output power and a voltage signal that varies in accordance with a voltage of the RF output power, phase-magnitude detector module including:
a first filter, the filter for receiving the current signal and generating a filtered current signal;
a second filter, the filter for receiving the voltage signal and generating a filtered voltage signal;
a lead network module for receiving the filtered current signal and applying a phase lead to the filtered current signal to generate a phase led signal;
a lag network module for receiving the filtered voltage signal and applying a phase lag to the filtered voltage signal to generate a phase lag signal; and
a dual logarithmic amplifier phase-magnitude detector, the dual logarithmic amplifier phase-magnitude detector receiving the phase led and phase lag signals, the dual logarithmic amplifier phase-magnitude detector generating a phase signal that varies in accordance with the phase between the voltage signal and the current signal and a magnitude signal that varies in accordance with the magnitude between the voltage and current signals; and
a controller for receiving the phase and magnitude signal and communicating control signal to the matching network.

20. The power generation system of claim 19 wherein the first and second filters are bandpass filters.

21. The power generation system of claim 20 wherein the first filter is one of a bandpass, low pass, or high pass filter and the second filter is one of a bandpass, high pass, or low pass filter.

* * * * *